(12) United States Patent
Huang et al.

(10) Patent No.: US 8,791,541 B2
(45) Date of Patent: Jul. 29, 2014

(54) BACKSIDE-ILLUMINATED IMAGE SENSOR HAVING A SUPPORTING SUBSTRATE

(75) Inventors: Kuan-Chieh Huang, Hsinchu (TW); Dun-Nian Yaung, Taipei (TW); Chih-Jen Wu, Hsin-Chu (TW); Chen-Ming Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 49 days.

(21) Appl. No.: 13/542,591

(22) Filed: Jul. 5, 2012

(65) Prior Publication Data

US 2013/0001725 A1    Jan. 3, 2013

Related U.S. Application Data

(63) Continuation of application No. 12/613,585, filed on Nov. 6, 2009, now Pat. No. 8,283,745.

(51) Int. Cl.
*H01L 21/00* (2006.01)

(52) U.S. Cl.
USPC .... 257/447; 257/292; 257/444; 257/E27.133; 257/E27.13; 438/65; 438/66; 438/57; 438/455

(58) Field of Classification Search
USPC .......... 257/444, 447, 433, 432, E27.133; 438/70, 66
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine et al. | |
| 6,645,830 B2 | 11/2003 | Shimoda et al. | |
| 6,664,129 B2 | 12/2003 | Siniaguine et al. | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |

(Continued)

*Primary Examiner* — Eva Yan Montalvo

(74) *Attorney, Agent, or Firm* — Haynes and Boone, LLP

(57) ABSTRACT

Provided is a method of fabricating a backside illuminated image sensor that includes providing a device substrate having a frontside and a backside, where pixels are formed at the frontside and an interconnect structure is formed over pixels, forming a re-distribution layer (RDL) over the interconnect structure, bonding a first glass substrate to the RDL, thinning and processing the device substrate from the backside, bonding a second glass substrate to the backside, removing the first glass substrate, and reusing the first glass substrate for fabricating another backside-illuminated image sensor.

19 Claims, 16 Drawing Sheets

(56) References Cited

U.S. PATENT DOCUMENTS

| | | |
|---|---|---|
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,267,603 B2 | 9/2007 | Jung |
| 7,297,574 B2 | 11/2007 | Thomas et al. |
| 7,335,972 B2 | 2/2008 | Chanchani |
| 7,355,273 B2 | 4/2008 | Jackson et al. |
| 7,859,033 B2 | 12/2010 | Brady |
| 2007/0152148 A1 | 7/2007 | Chao et al. |
| 2008/0303107 A1* | 12/2008 | Minamio et al. ............... 257/432 |
| 2010/0006963 A1* | 1/2010 | Brady ........................... 257/432 |

* cited by examiner

BACKSIDE-ILLUMINATED IMAGE SENSOR HAVING A SUPPORTING SUBSTRATE

CROSS-REFERENCE

This application claims priority from U.S. Non-provisional patent application Ser. No. 12/613,585, filed on Nov. 6, 2009, which is hereby incorporated by reference in its entirety.

TECHNICAL FIELD

The present disclosure relates generally to semiconductor manufacturing and, more particularly, to a backside-illuminated image sensor and method of fabricating the same.

BACKGROUND

In backside-illuminated image sensor (BSI) devices are used for sensing a volume of radiation (e.g., light) projected towards the back surface of a substrate. To do this, an image sensor device uses an array of image sensor elements (e.g., pixels). Each image sensor element includes at least one radiation sensing element, described herein, as a photodetector. The photodetectors may be formed on the front side of the substrate, and then a face to face (e.g., front side to front side) bonding with a carrier (support) material may be performed to avoid the risk of device wafer warping/breaking following thinning, the substrate being thin enough to allow the radiation incident on the back surface of the substrate to reach the photodetectors. Typically, the carrier material is formed of silicon which requires thinning and forming through-silicon-vias (TSV) for coupling to the interconnect structure of the image sensor device in chip packaging. However, this involves extra costs and cycle time for the fabrication process.

SUMMARY

One embodiment involves a method of fabricating a backside-illuminated image sensor. The method includes providing a device substrate having a frontside and a backside, wherein a plurality of pixels are formed at the frontside and an interconnect structure is formed over the pixels; forming a re-distribution layer (RDL) over the interconnect structure; bonding a first glass substrate to the RDL; thinning and processing the device substrate from the backside; bonding a second glass substrate to the backside; removing the first glass substrate; and reusing the first glass substrate for fabricating another backside-illuminated image sensor.

Another embodiment involves a backside-illuminated image sensor. The backside-illuminated image sensor includes a device substrate having a frontside and a backside; a plurality of pixels disposed at the frontside of the device substrate; an interconnect structure disposed over the pixels; a re-distribution layer disposed over the interconnect structure, wherein the RDL is coupled to the interconnect structure; and a glass substrate bonded to the backside of the device substrate.

Yet another embodiment involves a backside-illuminated image sensor. The backside-illuminated image sensor includes a device substrate having a frontside and backside; a plurality of pixels disposed at the frontside of the device substrate; an interconnect structure disposed over the pixels; a first glass substrate bonded to the frontside of the device substrate; and a second glass substrate bonded to the backside of the device substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to image sensors and more particularly, to a backside-illuminated image sensor. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Moreover, the formation of a first feature over, on, overlapping, overlying, underlying and the like, a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, or on a surface of a substrate, may include embodiments where features are formed above the surface of the substrate, adjacent to the surface of the substrate, directly on the surface of the substrate, and/or extending below the surface of the substrate (such as implanted regions).

Figure 1:
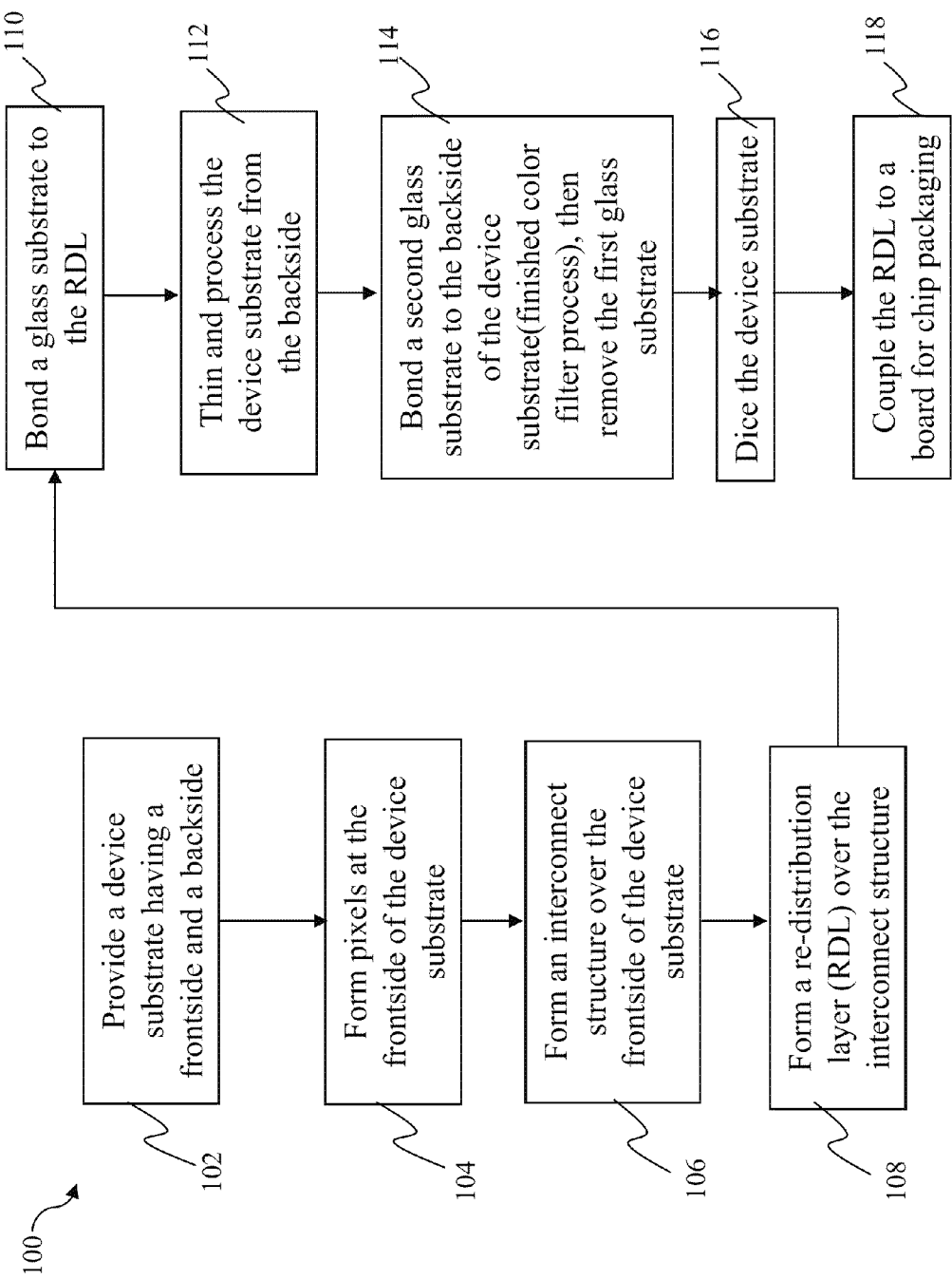
FIG. 1 is a flowchart of a method of fabricating a backside-illuminated image sensor (BSI) device according to an embodiment of the present disclosure.

Referring to FIG. 1, illustrated is a flowchart of a method 100 of fabricating a backside-illuminated image sensor (BSI) device according to an embodiment of the present disclosure. The method 100 begins with block 102 in which a device substrate having a frontside and a backside is provided. The method 100 continues with block 104 in which a plurality of pixels are formed at the frontside of the device substrate. The method 100 continues with block 106 in which an interconnect structure is formed over the frontside of the device substrate. The method 100 continues with block 108 in which a re-distribution layer (RDL) is formed over the interconnect structure.

The method 100 continues with block 110 in which a first glass substrate is bonded to the RDL. The method 100 continues with block 112 in which the device substrate is thinned down and processed from the backside. The method 100 continues with block 114 in which a second glass substrate is bonded to the backside of the device substrate (finish color filter process), and then remove the first glass substrate. The method 100 continues with block 116 in which the device substrate is diced to separate the BSI device. The method 100 continues with block 118 in which the RDL is coupled to a board for chip packaging the BSI device. The discussion that follows illustrates an embodiment of a BSI device that can be fabricated according to the method 100 of FIG. 1.

Figure 2:
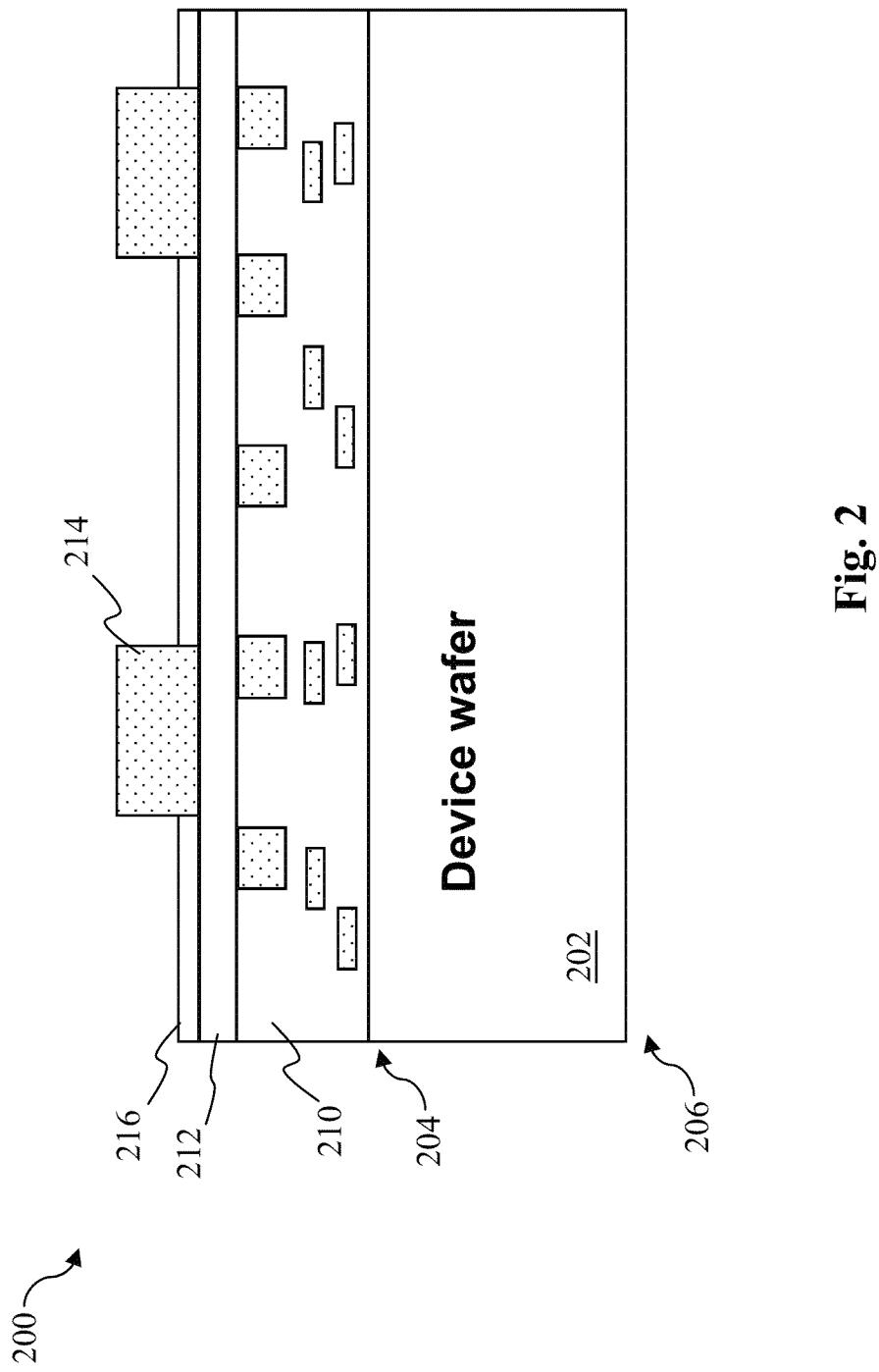
FIGS. 2-8 are cross-sectional views of a BSI device at various stages of fabrication according to the method of FIG. 1.

Referring to FIGS. 2-8, illustrated are cross-sectional views of an embodiment of a BSI device 200 at various stages of fabrication according to the method 100 of FIG. 1. It is understood that FIGS. 2-8 have been simplified for the sake of clarity to better understand the inventive concepts of the present disclosure. In FIG. 2, the BSI device 200 includes an array of image sensor elements or pixels. The BSI device 200 may be a complementary metal oxide semiconductor (CMOS) image sensor (CIS) or active pixel sensor. In other embodiments, the BSI device 200 is a charge coupled device (CCD) sensor or passive pixel sensor. The pixels may include photodetectors for detecting an intensity or brightness of radiation. In an embodiment, the photodetector includes a photodiode. In a further embodiment, the photodetector includes a pinned photodiode. Other examples of photodetectors include photogate detectors, phototransistors, and/or other detectors known in the art. The pixels may also include various transistors such as reset transistors, source follower transistors, selector transistors, and/or transfer transistors. Additional circuitry and input/outputs are typically provided adjacent to the array of pixels for providing an operation environment for the pixels and for supporting external communications with the pixels.

The BSI device 200 includes a device substrate 202. The device substrate 202 includes a silicon wafer in a crystalline structure. The device substrate 202 may further include an epitaxial (epi) layer grown on a substrate layer. The epi layer may include a dopant of the same type or a different type than the underlying substrate layer. The doping may be accomplished using conventional processes such as ion implantation or diffusion. The device substrate 202 has a frontside 204 and a backside 206. The various microelectronic elements (shown in FIG. 7), such as the photodetectors and the transistors, are formed at the frontside 204 of the device substrate 202. An inter-level dielectric (ILD), such as silicon oxide, is formed over the frontside 204 of the device substrate 202.

The BSI device 200 further includes an interconnect structure 210 formed over the ILD at the frontside 204 of the device substrate 202. The interconnect structure 210 includes metal layers and inter-metal dielectric (IMD). The metal layers provide connections between the various microelectronic devices of the BSI device 200. The number of metal layer may vary depending on design requirements. The metal layers are coupled to each other by vias. A topmost metal layer may include metal pads for coupling to bonding pads as discussed below. The IMD may include a low-k material, as compared to a dielectric constant of silicon dioxide. Alternatively, the IMD may include carbon-doped silicon oxide, fluorine-doped silicon oxide, silicon oxide, silicon nitride, and/or organic low-k material. The IMD may be formed by spin-on coating, chemical vapor deposition (CVD), physical vapor deposition (PVD), atomic layer deposition (ALD), or other suitable technique. The material of the metal layers may include aluminum, copper, tungsten, titanium, titanium nitride, tantalum, tantalum nitride, metal silicide or combination thereof. Additionally, the metal layers and IMD may be formed in an integrated process such as a damascene process or lithography/plasma etching process.

The BSI device 200 further includes one or more passivation layers 212 to cover and protect the interconnect structure 210 and the device. The passivation layer 212 may be formed of silicon nitride, silicon oxynitride, silicon oxide, combinations thereof, or other suitable materials. The passivation layer 212 may be formed by spin-on coating CVD, PVD, ALD, or other suitable technique. The passivation layer 212 may include openings in which bonding pads are formed on the metal pads of the topmost metal layer of the interconnect structure 210. The bonding pads are configured to provide electrical connection with the interconnect structure 210 for wafer level testing, wiring, or chip packaging. The bonding pads may be formed within the passivation layer 212 by a process known in the art. For example, an etching process may be performed on the passivation layer 212 to open up the metal pad of the topmost metal layer. A conductive material layer may be deposited over the passivation layer 212 filling in the opening. The conductive material layer may then be patterned to form the bonding pads. The bonding pads may include an electrically conductive material such as aluminum, aluminum alloy, copper, copper alloy, or combinations thereof.

The BSI device 200 further includes a re-distribution layer (RDL) 214 formed over the passivation layer 212. The RDL 214 is designed to redistribute or relocate the bonding pads for chip packaging. The RDL 214 is isolated from the device substrate 202 except for the connection to the bonding pads. The RDL 214 may be formed by depositing a dielectric layer 216, such as silicon nitride, silicon oxide, or other suitable materials, over the passivation layer 212. The dielectric layer 216 may be formed by spin-on coating CVD, PVD, ALD, or other suitable technique. The dielectric layer 216 is patterned and etched to expose the bonding pads. One or more conductive material layers are deposited over the dielectric layer 216. The conductive material layers may include titanium, copper, copper, nickel, or combinations thereof. The conductive material layer is patterned and etched to form conductive lines that relocate the original bonding pads to a desired location over the device substrate 202. Another dielectric layer is formed over the conductive lines, and patterned so that the new bonding pads are exposed at the desired location.

Figure 3:
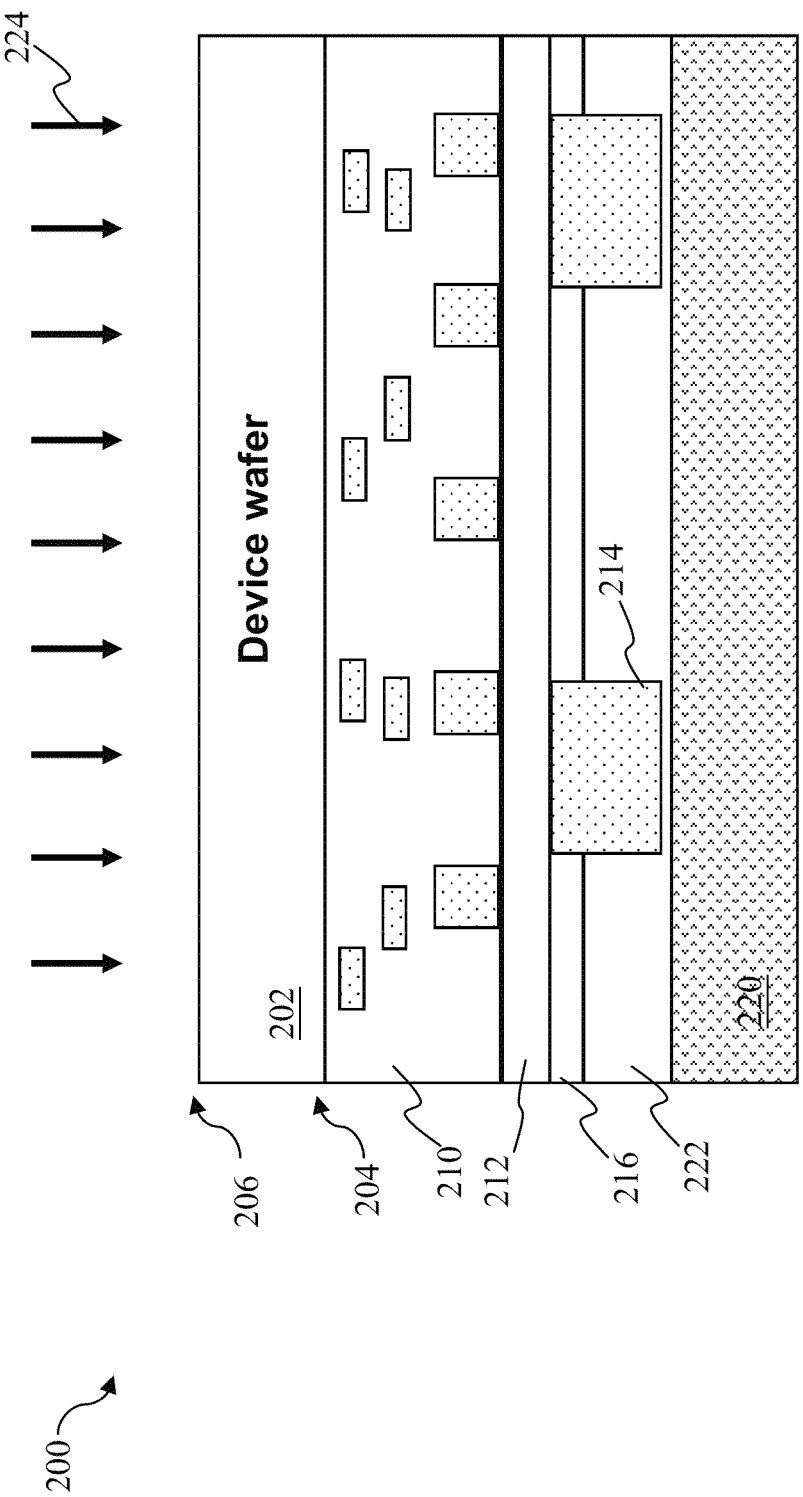

In FIG. 3, a glass substrate 220 is bonded to the RDL 214 at the frontside 204 so that processing the backside 206 of the device substrate 202 may be performed. The glass substrate 220 may provide protection for the various features formed on the frontside 204, and may provide mechanical strength and support when processing the backside 206 of the device substrate 202. The glass substrate 220 includes a thickness ranging from about 100 to about 1000 μm. In an embodiment, the glass substrate 220 has a thickness ranging from about 400 to about 800 μm. The glass substrate 220 is bonded to the RDL 214 with an adhesive 222. In the present embodiment, the adhesive 222 has a bonding temperature ranging from about 200° C. to about 300° C. It is understood that other adhesives with different bonding temperatures may be used as well.

As discussed above, the BSI device 200 may include pixels that are formed at the front side 204 of the device substrate 202. Accordingly, the device substrate 202 may be thinned down enough to allow the radiation incident on the backside 206 of the device substrate 202 to reach the pixels. For example, the device substrate (prior to the thinning) may have a thickness that is about 750 μm. The device substrate 202 may be thinned down 224 from the backside 206 by various techniques such as grinding, etching, chemical mechanical polishing (CMP), or combinations thereof. After thinning, the device substrate 202 has a thickness ranging from about 1 to about 10 μm. It is understood that the particular thicknesses disclosed herein are mere examples and that other thickness may be implemented depending on the type of application and design requirements of the semiconductor device.

Figure 4:
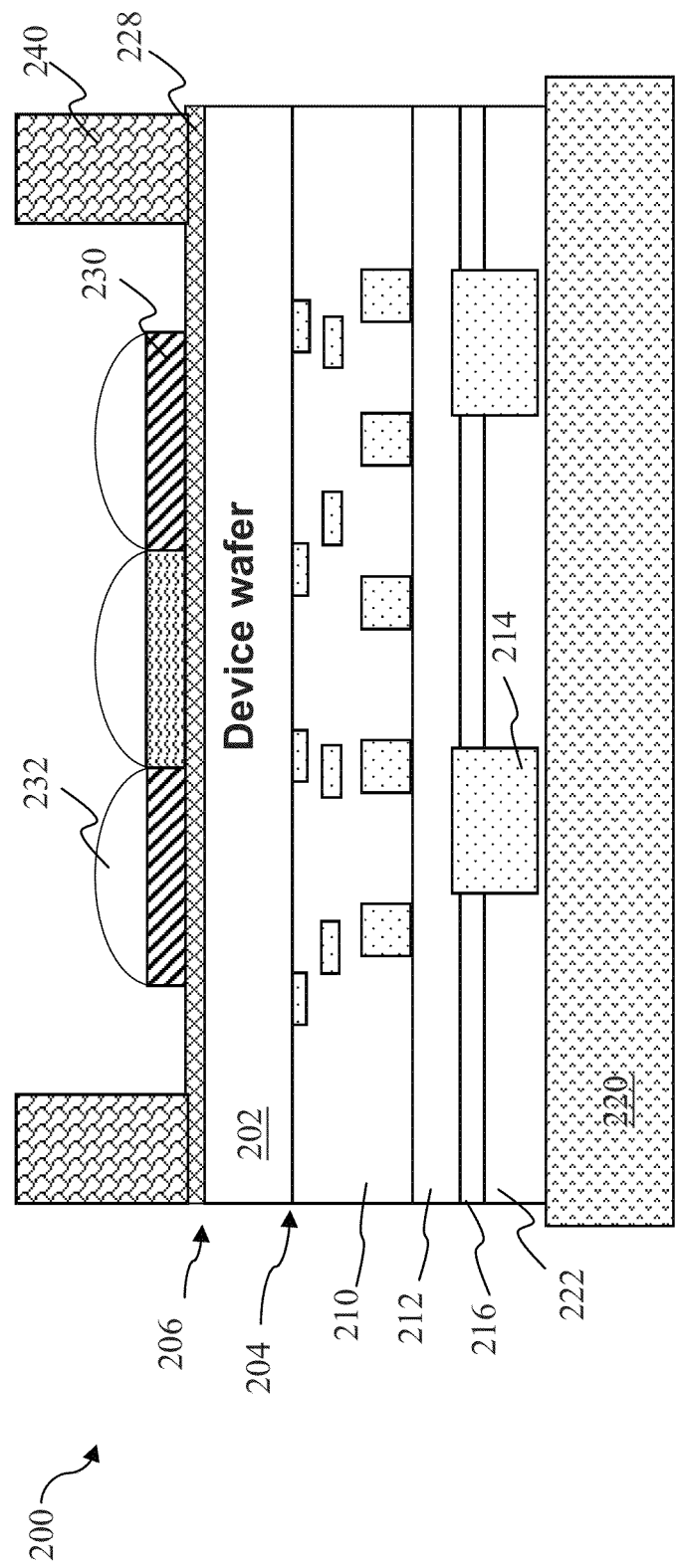

In FIG. 4, a planarization layer 228 is formed over the thinned backside 206 of the device substrate 202. The planarization layer 228 is formed of an organic or polymeric material that has a high transmittance rate for light radiation. This allows light to pass through with little distortion and be detected by the pixels. The planarization layer 228 may be formed by spin-on coating or other suitable technique which provides a uniform and planar surface. The BSI device 200 further includes a color filter layer 230 formed over the planarization layer 228. In the present embodiment, the color filter layer 230 includes filters that can support several different colors (e.g., red, green, and blue), and are positioned such that incident light is directed thereon and therethrough to their respective pixels. The color filter layer 230 may be formed of a polymeric material or resin including color pigments. The BSI device 200 further includes a plurality of microlenses 232 in various positional arrangements with the color filter layer 230 and pixels. The microlenses 232 are designed to focus light directed toward the backside 206 of the device substrate 202 to the pixels at the frontside 204. A dam structure 240 is formed to surround the color filter layer 230 and the microlenses 232. The dam structure 240 includes a height ranging from about 0.5 to about 1 µm.

Figure 5:
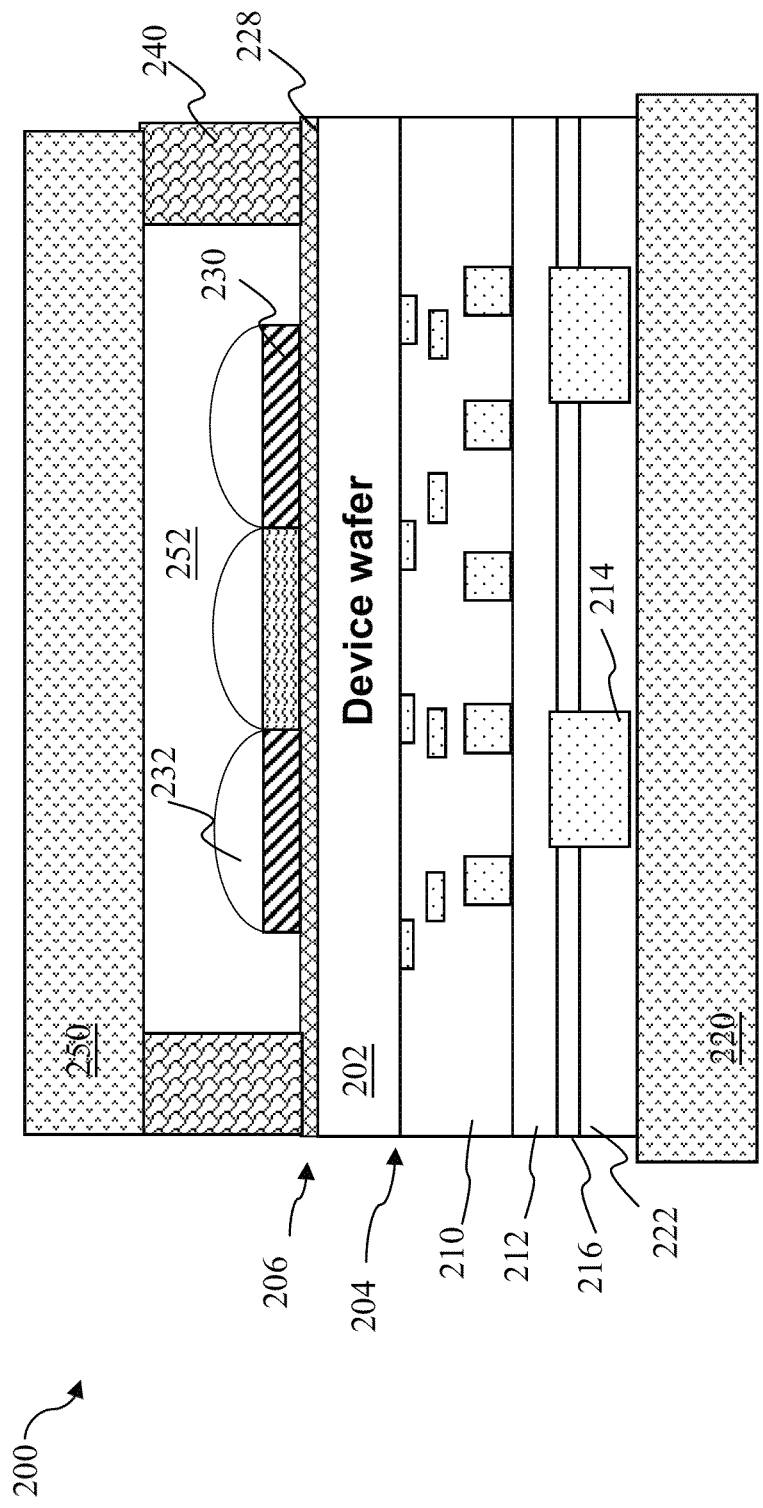

In FIG. 5, a glass substrate 250 is coupled to the dam structure 240 thereby forming a cavity 252 that protects and houses the color filter layer 230 and microlenses 232. The glass substrate 250 includes a thickness ranging from about 100 to about 1000 µm. In an embodiment, the glass substrate 250 has a thickness ranging from about 400 to about 800 µm. In an embodiment, the cavity 252 is filled with air or other suitable inert gas. In other embodiments, the cavity 252 may be filled with an epoxy or other suitable transparent material.

Figure 6:
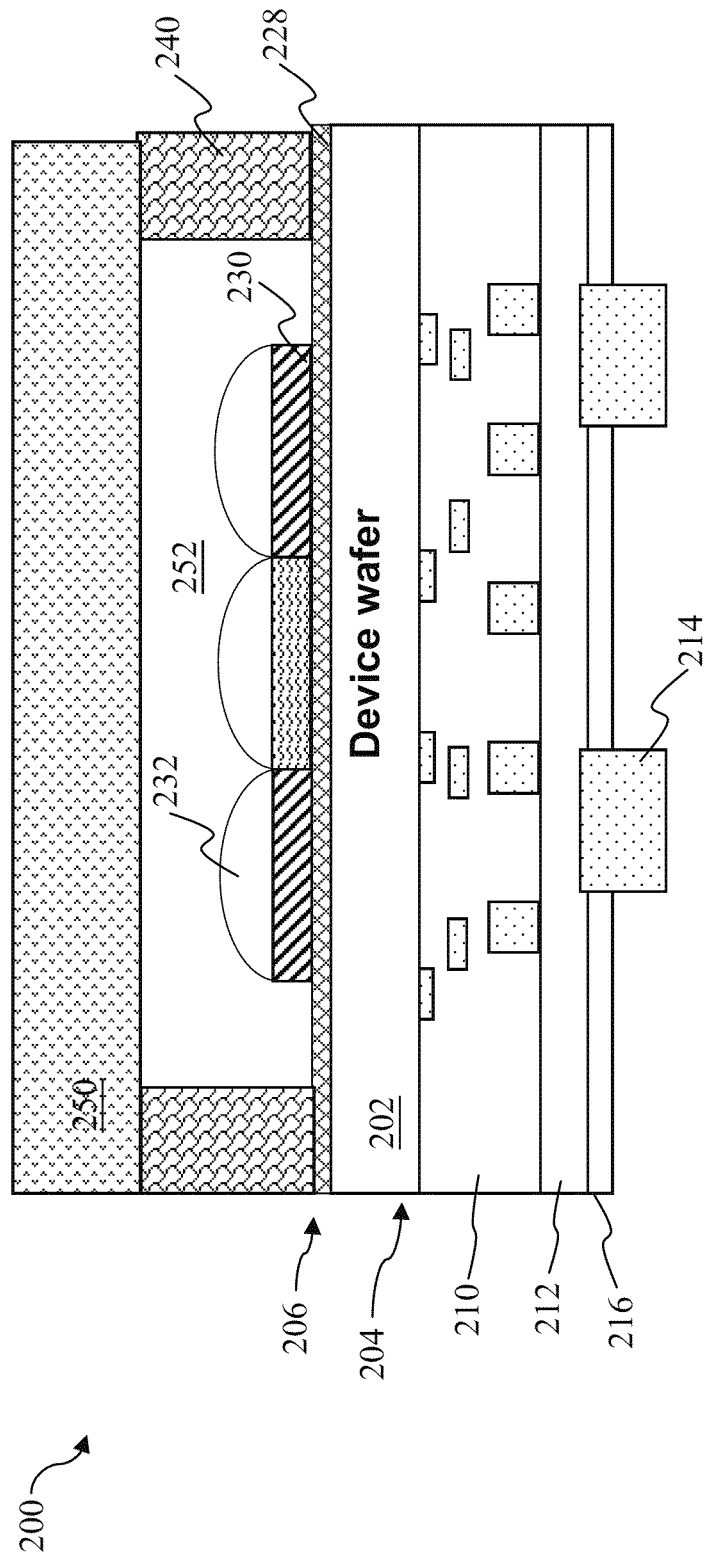
Figure 7:
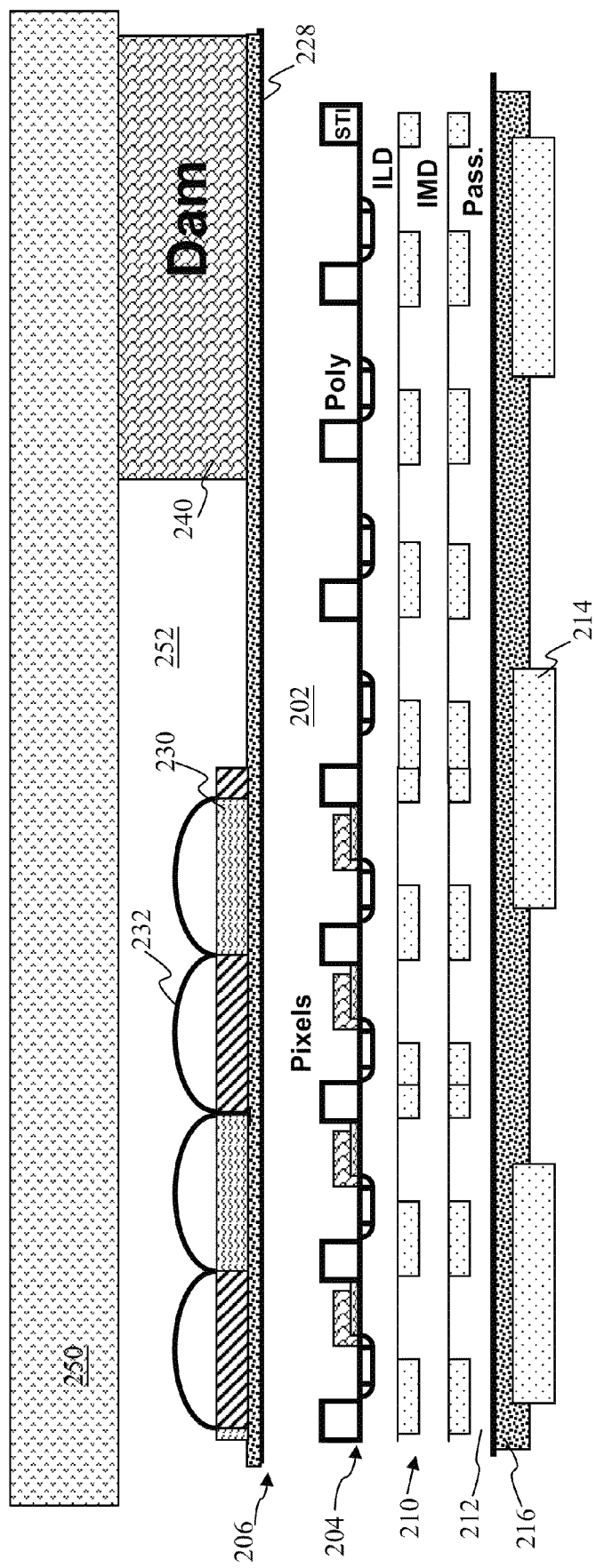

In FIGS. 6 and 7 (more detailed cross-sectional view), the glass substrate 220 is removed. The glass substrate 220 is de-bonded from the RDL 214 at a temperature that is greater than the bonding temperature of the adhesive layer 222. In the present embodiment, the de-bonding temperature ranges from about 250° C. to about 350° C. The glass substrate 220 may be recycled for use in fabricating another BSI device in a similar manner, and thus reduces fabrication costs. The device substrate 202 is then diced to separate the BSI device 200 from other BSI devices or other integrated circuits (e.g., dies) formed on the same device substrate. The device substrate 202 may be diced by a die-sawing process at scribe lines that are provided between adjacent dies.

Figure 8:
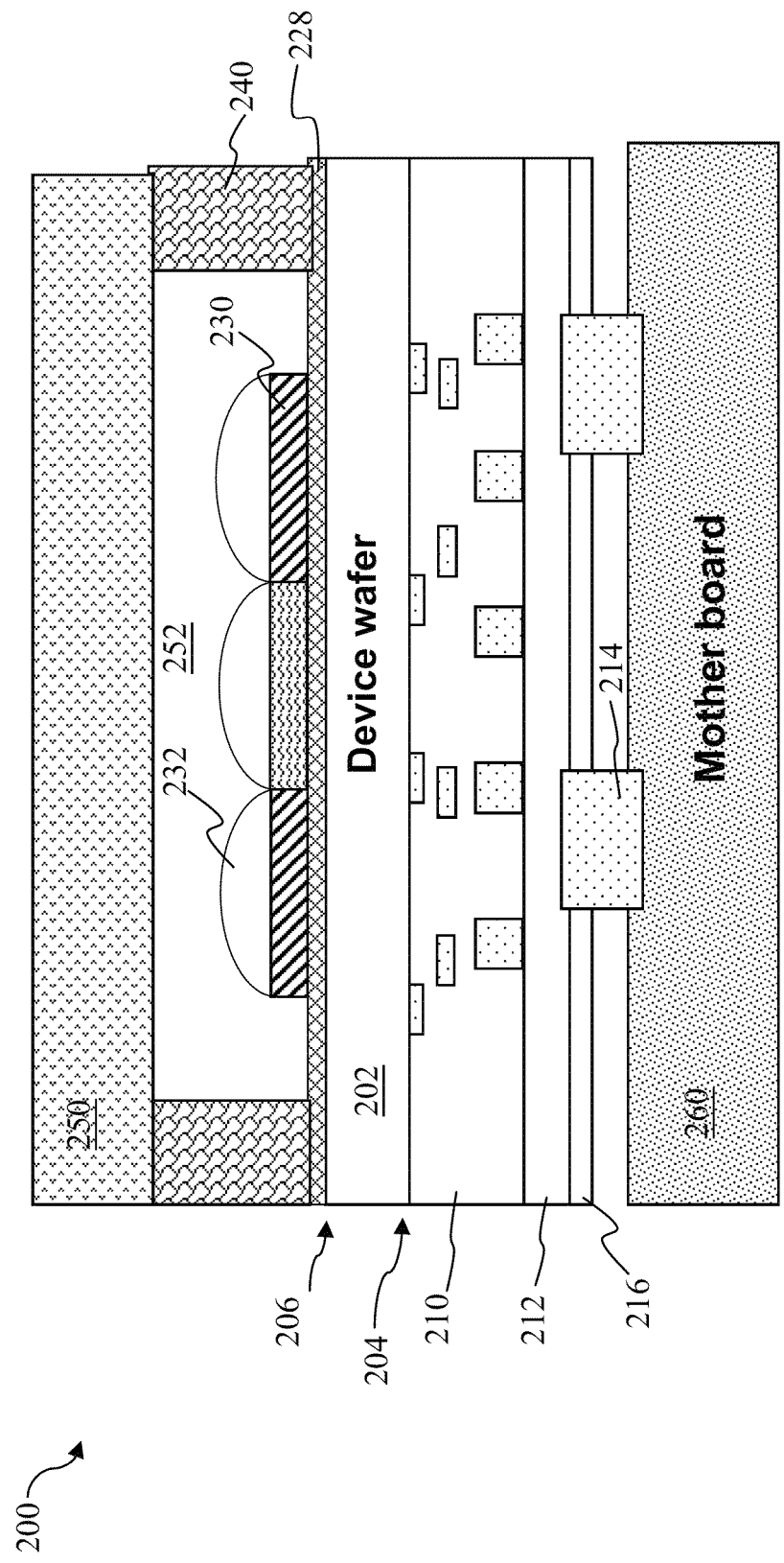

In FIG. 8, the BSI device 200 is coupled to a mother board 260 for chip packaging. The RDL 214 is coupled to the mother board 260 using various technologies such as flip-chip, ball grid array, wire bonding, chip bonding, and solder bump bonding. In an embodiment, under bump metallization (UBM) structures are formed in contact with the bonding pads of the RDL 214. Bonding structures such as solder balls are then formed on the UBM structures to connect to the mother board 260. It is noted that utilizing the recyclable glass substrate 220 instead of a carrier silicon substrate reduces fabrication costs and cycle time, and thus simplifies the fabrication process. As noted above, the glass substrate may be re-used in fabricating another BSI device. Additionally, the glass substrate does not have to be thinned down and through silicon vias (TSV) do not have to be formed for coupling to the interconnect structure 210 of the BSI device 200 during chip packaging. Further, chip packaging may be performed at an assembly house of a customer instead of the fabrication house (e.g., foundry) since thinning and TSV processing is not required.

Figure 9:
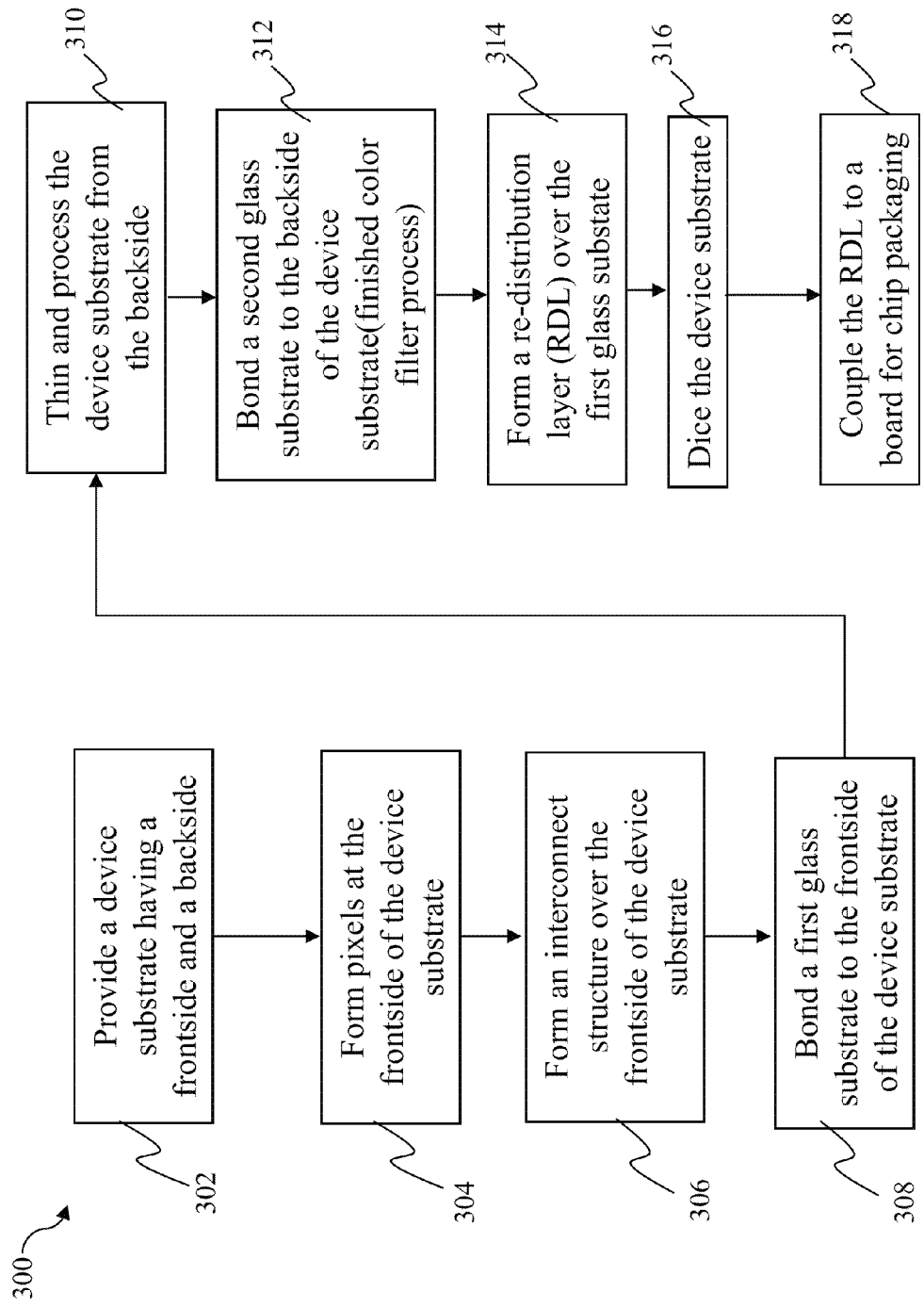
FIG. 9 is a flowchart of a method for fabricating a BSI device according to another embodiment of the present disclosure.

Referring to FIG. 9, illustrated is a flowchart of a method 300 of fabricating a backside-illuminated image sensor (BSI) device according to an embodiment of the present disclosure. The method 300 begins with block 302 in which a device substrate having a frontside and a backside is provided. The method 300 continues with block 304 in which a plurality of pixels are formed at the frontside of the device substrate. The method 300 continues with block 306 in which an interconnect structure is formed over the frontside of the device substrate. The method 300 continues with block 308 in which a first glass substrate is bonded to the frontside of the device substrate.

The method 300 continues with block 310 in which the device substrate is thinned down and processed from the backside. The method 300 continues with block 312 in which a second glass substrate is bonded to the backside of the device substrate (finish color filter process). The method 300 continues with block 314 in which a re-distribution layer (RDL) is formed over the first glass substrate. The method 300 continues with block 316 in which the device substrate is diced to separate the BSI device. The BSI device includes the first and second glass substrates. The method 100 continues with block 318 in which the RDL is coupled to a board for chip packaging the BSI device. The discussion that follows illustrates another embodiment of a BSI device that can be fabricated according to the method 300 of FIG. 9.

Figure 10:
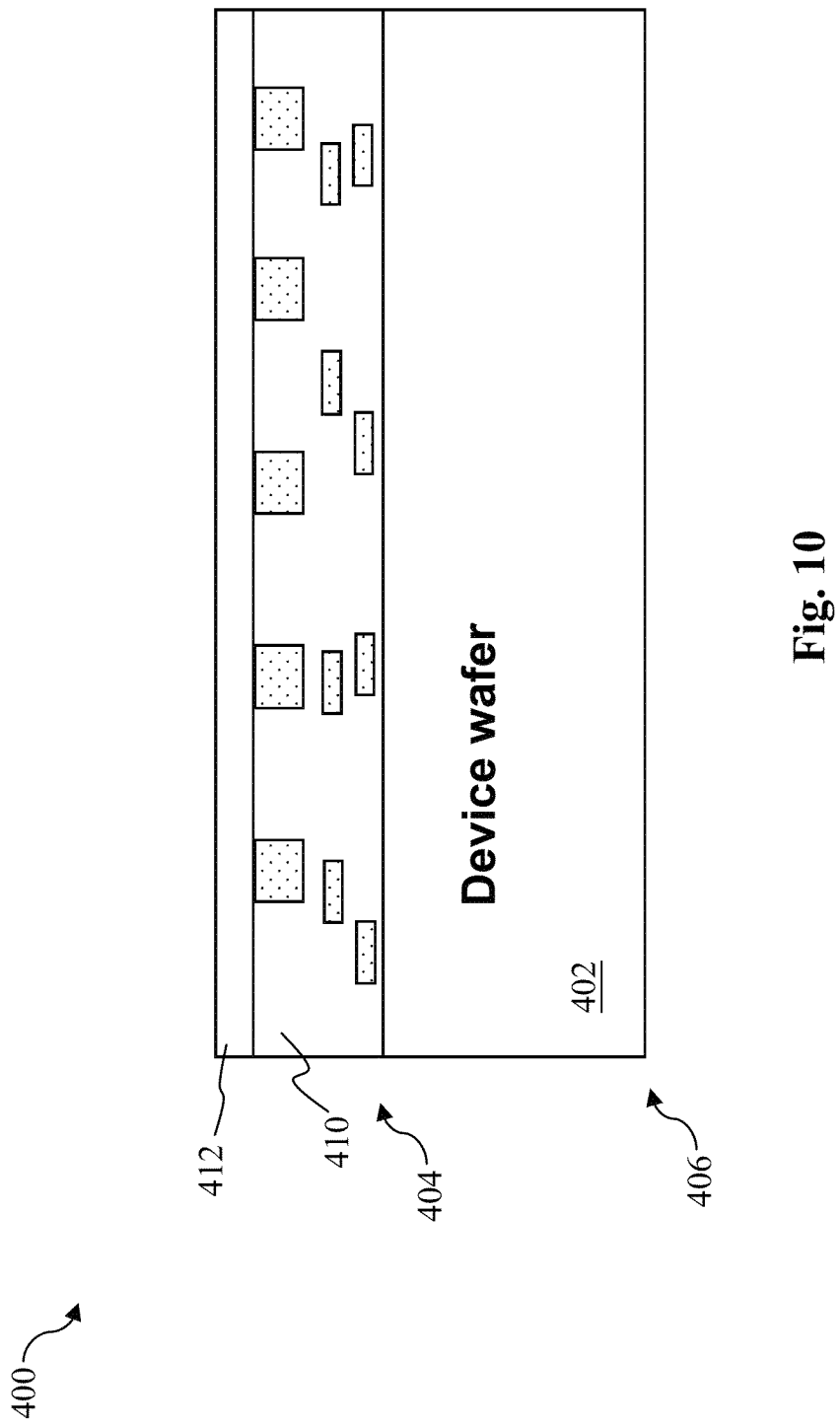
FIGS. 10-16 are cross-section views of another BSI at various stages of fabrication according to the method of FIG. 9.

Referring to FIGS. 10-16, illustrated are cross-sectional views of an embodiment of a BSI device 400 at various stages of fabrication according to the method 300 of FIG. 9. It is understood that FIGS. 10-16 have been simplified for the sake of clarity to better understand the inventive concepts of the present disclosure. In FIG. 10, the BSI device 400 includes an array of image sensor elements or pixels. The BSI device 400 may be a complementary metal oxide semiconductor (CMOS) image sensor (CIS) or active pixel sensor. In other embodiments, the BSI device 400 is a charge coupled device (CCD) sensor or passive pixel sensor. The pixels may include photodetectors for detecting an intensity or brightness of radiation. In an embodiment, the photodetector includes a photodiode. In a further embodiment, the photodetector includes a pinned photodiode. Other examples of photodetectors include photogate detectors, phototransistors, and/or other detectors known in the art. The pixels may also include various transistors such as reset transistors, source follower transistors, selector transistors, and/or transfer transistors. Additional circuitry and input/outputs are typically provided adjacent to the array of pixels for providing an operation environment for the pixels and for supporting external communications with the pixels.

The BSI device 400 includes a device substrate 402. The device substrate 402 includes a silicon wafer in a crystalline structure. The device substrate 402 may further include an epitaxial (epi) layer grown on a substrate layer. The epi layer may include a dopant of the same type or a different type than the underlying substrate layer. The doping may be accomplished using conventional processes such as ion implantation or diffusion. The device substrate 402 has a frontside 404 and a backside 406. The various microelectronic elements (shown in FIG. 15), such as the photodetectors and the transistors, are formed at the frontside 404 of the device substrate 402. An inter-level dielectric (ILD), such as silicon oxide, is formed over the frontside 404 of the device substrate 402.

The BSI device 400 further includes an interconnect structure 410 formed over the ILD at the frontside 404 of the device substrate 402. The interconnect structure 410 includes metal layers and inter-metal dielectric (IMD). The metal layers provide connections between the various microelectronic devices of the BSI device 400. The number of metal layer may vary depending on design requirements. The metal layers are coupled to each other by vias. A topmost metal layer may include metal pads for coupling to bonding pads as discussed below. The IMD may include a low-k material, as compared to a dielectric constant of silicon dioxide. Alternatively, the IMD may include carbon-doped silicon oxide, fluorine-doped silicon oxide, silicon oxide, silicon nitride, and/or organic low-k material. The IMD may be formed by spin-on coating, chemical vapor deposition (CVD), physical vapor deposition (PVD), atomic layer deposition (ALD), or other suitable technique. The material of the metal layers may include aluminum, copper, tungsten, titanium, titanium nitride, tantalum, tantalum nitride, metal silicide or combination thereof. Additionally, the metal layers and IMD may be formed in an integrated process such as a damascene process or lithography/plasma etching process.

The BSI device 400 further includes one or more passivation layers 412 to cover and protect the interconnect structure 410 and the device. The passivation layer 412 may be formed of silicon nitride, silicon oxynitride, silicon oxide, combinations thereof, or other suitable materials. The passivation layer 412 may be formed by spin-on coating CVD, PVD, ALD, or other suitable technique. The passivation layer 412 may include openings in which bonding pads are formed on the metal pads of the topmost metal layer of the interconnect structure 410. The bonding pads are configured to provide electrical connection with the interconnect structure 410 for wafer level testing, wiring, or chip packaging. The bonding pads may be formed within the passivation layer 412 by a process known in the art. For example, an etching process may be performed on the passivation layer 412 to open up the metal pad of the topmost metal layer. A conductive material layer may be deposited over the passivation layer 412 filling in the opening. The conductive material layer may then be patterned to form the bonding pads. The bonding pads may include an electrically conductive material such as aluminum, aluminum alloy, copper, copper alloy, or combinations thereof.

Figure 11:
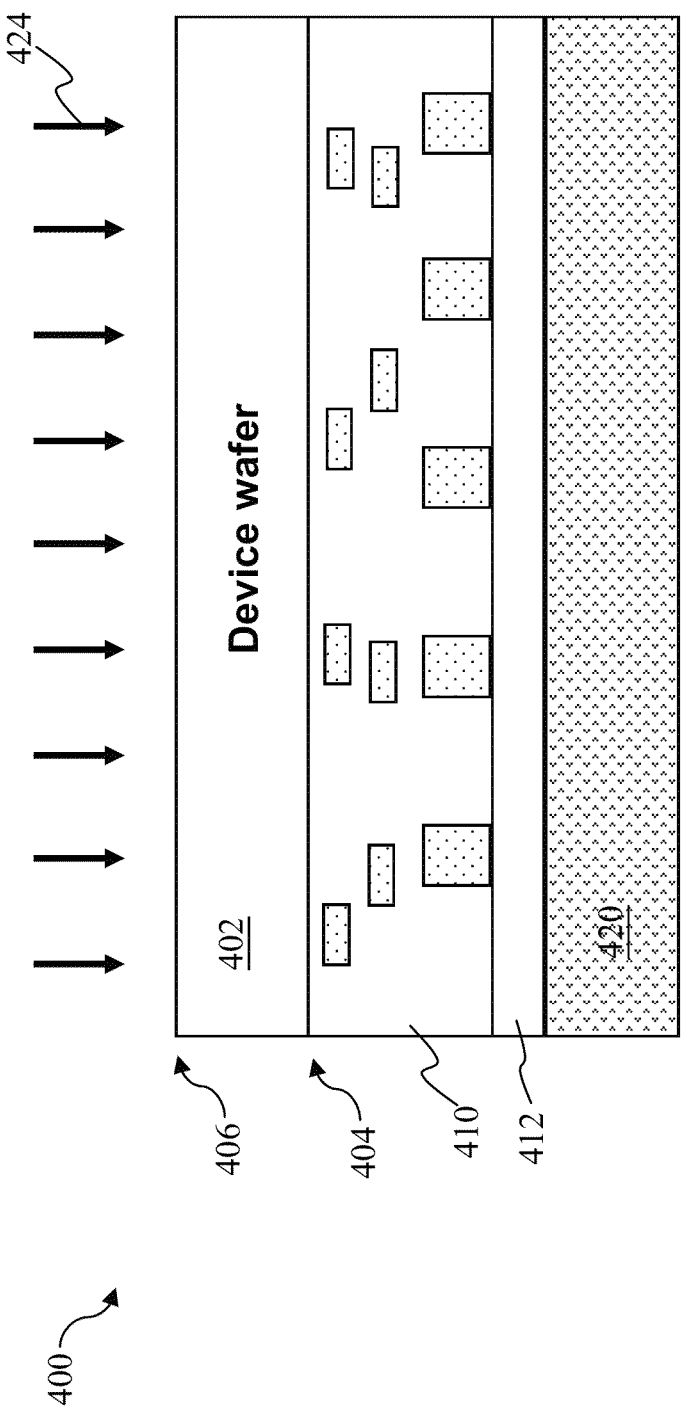

In FIG. 11, a glass substrate 420 is bonded to the passivation layer 412 at the frontside 404 so that processing the backside 406 of the device substrate 402 may be performed. The glass substrate 420 may provide protection for the various features formed on the frontside 404, and may provide mechanical strength and support when processing the backside 406 of the device substrate 402. The glass substrate 420 includes a thickness ranging from about 100 to about 1000 μm. In an embodiment, the glass substrate 420 has a thickness ranging from about 400 to about 800 μm. The glass substrate 420 is bonded to the passivation layer 412 with an adhesive, epoxy, or other suitable material.

As discussed above, the BSI device 400 may include pixels that are formed at the frontside 404 of the device substrate 402. Accordingly, the device substrate 402 may be thinned down enough to allow the radiation incident on the backside 406 of the device substrate 402 to reach the pixels. For example, the device substrate (prior to the thinning) may have a thickness that is about 750 μm. The device substrate 402 may be thinned down 424 from the backside 406 by various techniques such as grinding, etching, CMP, or combinations thereof. After thinning, the device substrate 402 has a thickness ranging from about 1 to about 10 μm. It is understood that the particular thicknesses disclosed herein are mere examples and that other thickness may be implemented depending on the type of application and design requirements of the semiconductor device.

Figure 12:
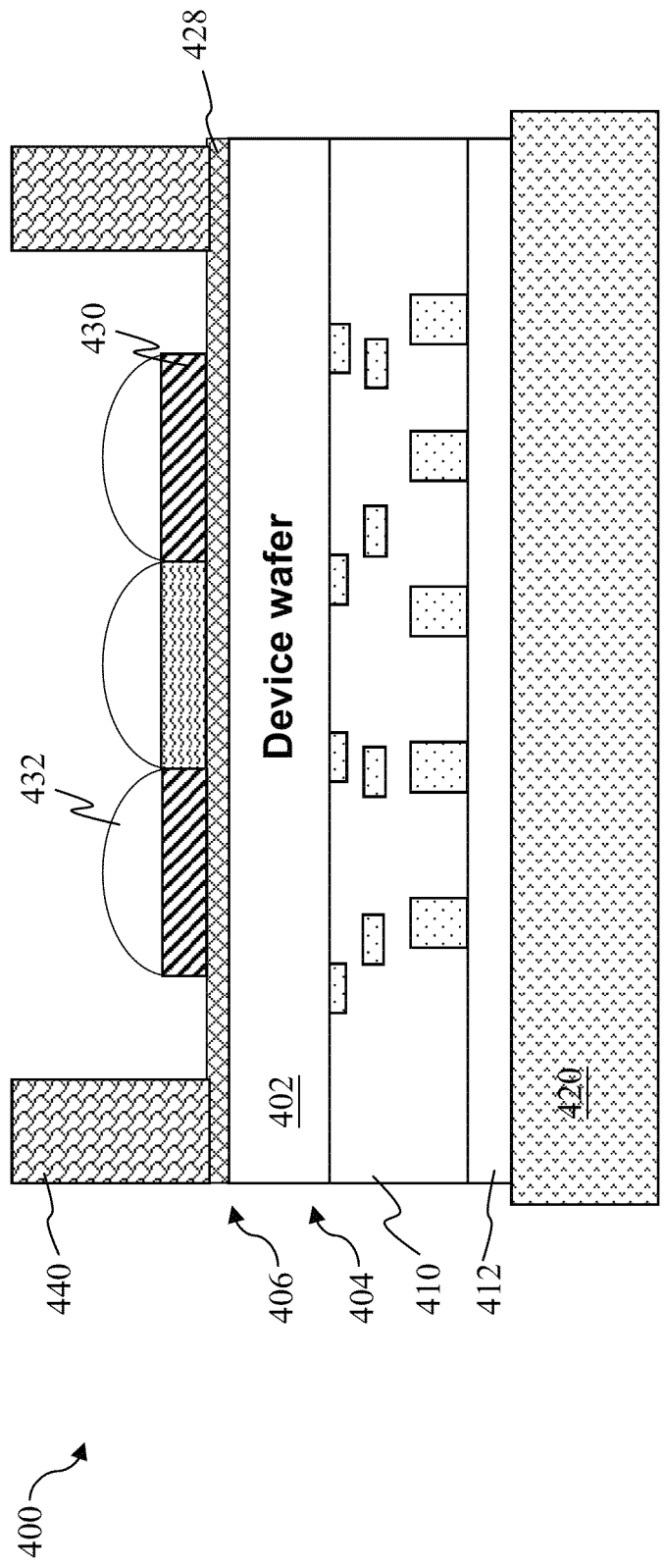

In FIG. 12, a planarization layer 428 is formed over the thinned backside 406 of the device substrate 402. The planarization layer 428 is formed of an organic or polymeric material that has a high transmittance rate for light radiation. This allows light to pass through with little distortion and be detected by the pixels. The planarization layer 428 may be formed by spin-on coating or other suitable technique which provides a uniform and planar surface. The BSI device 400 further includes a color filter layer 430 formed over the planarization layer 428. In the present embodiment, the color filter layer 430 includes filters that can support several different colors (e.g., red, green, and blue), and are positioned such that incident light is directed thereon and therethrough to their respective pixels. The color filter layer 430 may be formed of a polymeric material or resin including color pigments. The BSI device 400 further includes a plurality of microlenses 432 in various positional arrangements with the color filter layer 430 and pixels. The microlenses 432 are designed to focus light directed toward the backside 406 of the device substrate 402 to the pixels at the frontside 404. A dam structure 440 is formed to surround the color filter layer 430 and the microlenses 432. The dam structure 440 includes a height ranging from about 0.5 to about 1 μm.

Figure 13:
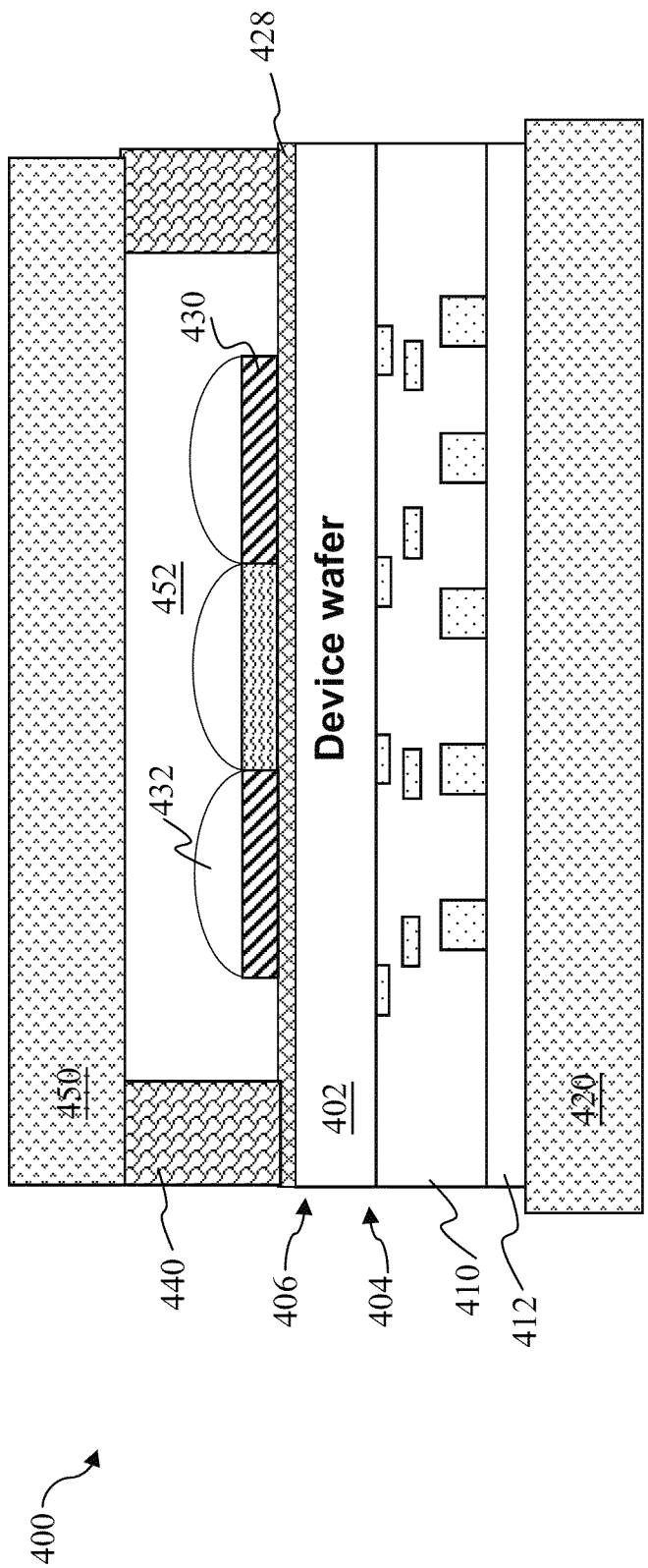

In FIG. 13, a glass substrate 450 is coupled to the dam structure 440 thereby forming a cavity 452 that protects and houses the color filter layer 430 and microlenses 432. The glass substrate 450 includes a thickness ranging from about 100 to about 1000 μm. In an embodiment, the glass substrate 450 has a thickness ranging from about 400 to about 800 μm. In an embodiment, the cavity 452 is filled with air or other suitable inert gas. In other embodiments, the cavity 452 may be filled with an epoxy or other suitable transparent material.

Figure 14:
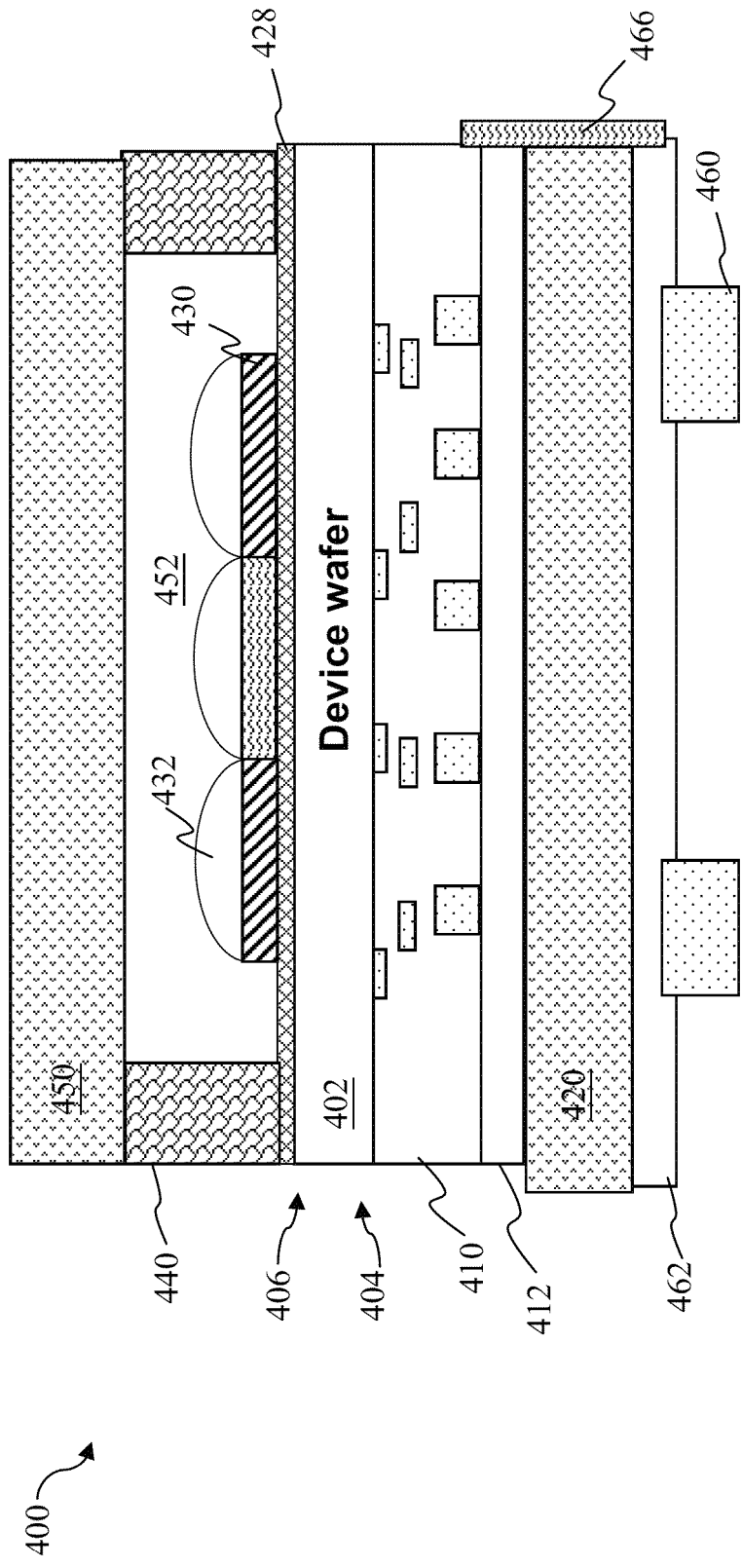
Figure 15:
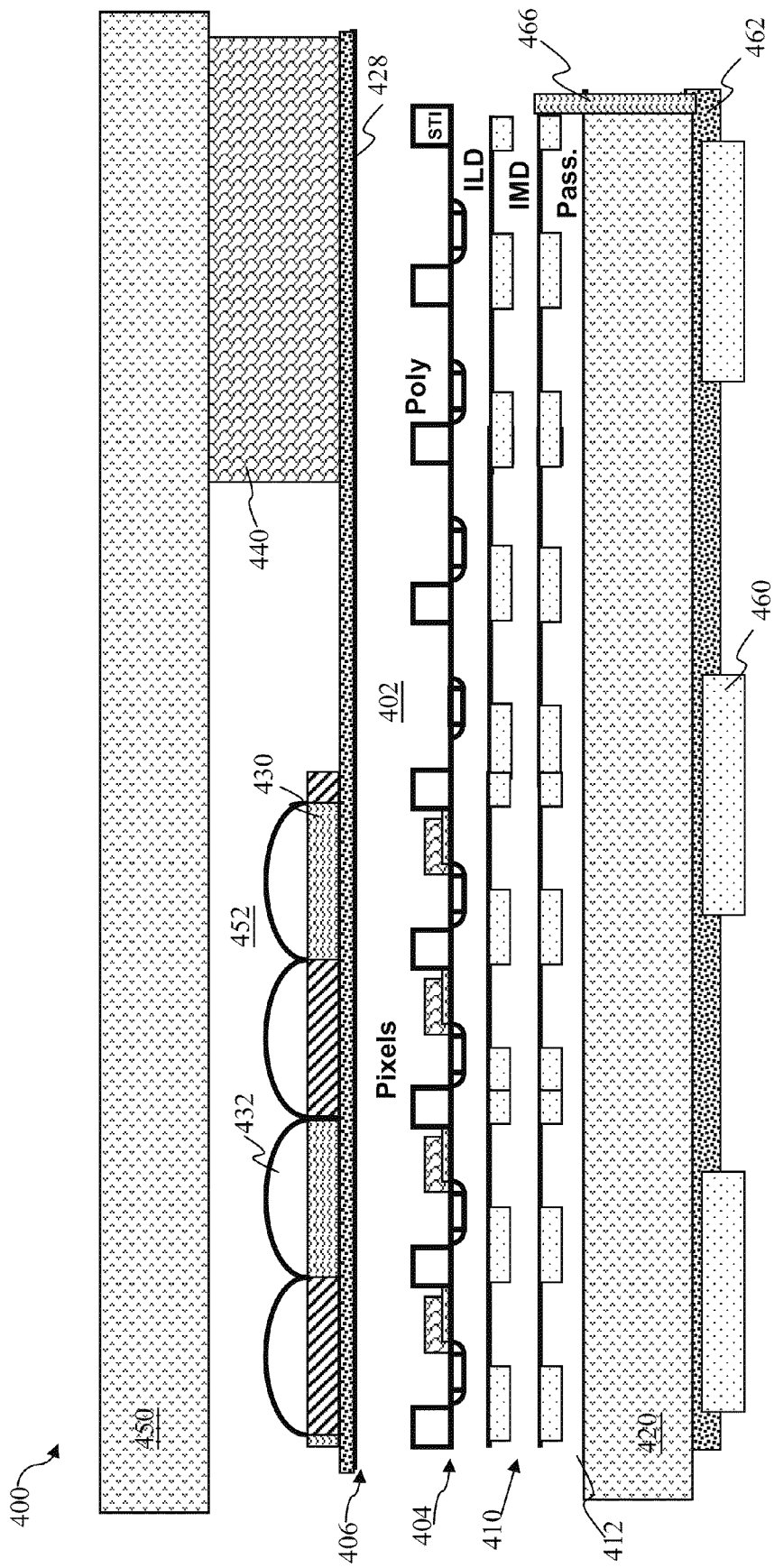

In FIGS. 14 and 15 (more detailed cross-sectional view), the BSI device 400 further includes a re-distribution layer (RDL) 460 formed over the glass substrate 420. The RDL 460 is designed to redistribute or relocate the bonding pads of the interconnect structure for chip packaging. The RDL 460 is isolated from the device substrate 402 except for the connection to the bonding pads. The RDL 460 may be formed by depositing a dielectric layer 462, such as silicon nitride, silicon oxide, or other suitable materials, over the glass substrate 420. The dielectric layer 462 may be formed by spin-on coating CVD, PVD, ALD, or other suitable technique. The dielectric layer 462 is patterned and etched to expose a portion of the glass substrate 420 directly overlying a scribe line that is provided between adjacent dies. A notch is etched in the substrate and the underlying IMD layer of the interconnect structure 410 to expose the bonding pad.

A sidewall contact assembly 466 is formed in contact with a side of the bonding pad by depositing one or more conductive material layers over the dielectric layer 462 partially filling the notch. The conductive material layers may include titanium, copper, copper, nickel, or combinations thereof. The conductive material layer is patterned and etched to form conductive lines that relocate the original bonding pads to a desired location over the device substrate 402. A passivation layer is formed over the conductive lines and sidewall contact assembly 466, and patterned so that the new bonding pads are exposed at the desired location. In an embodiment, a solder mask may be formed to cover and protect the contact lines and sidewall contact assembly 466 of the RDL 460. The device substrate 402 is then diced to separate the BSI device 400 from other BSI devices or other integrated circuits (e.g., dies) formed on the same device substrate. The device substrate 402 may be diced at the notched region of the glass substrate 420.

Figure 16:
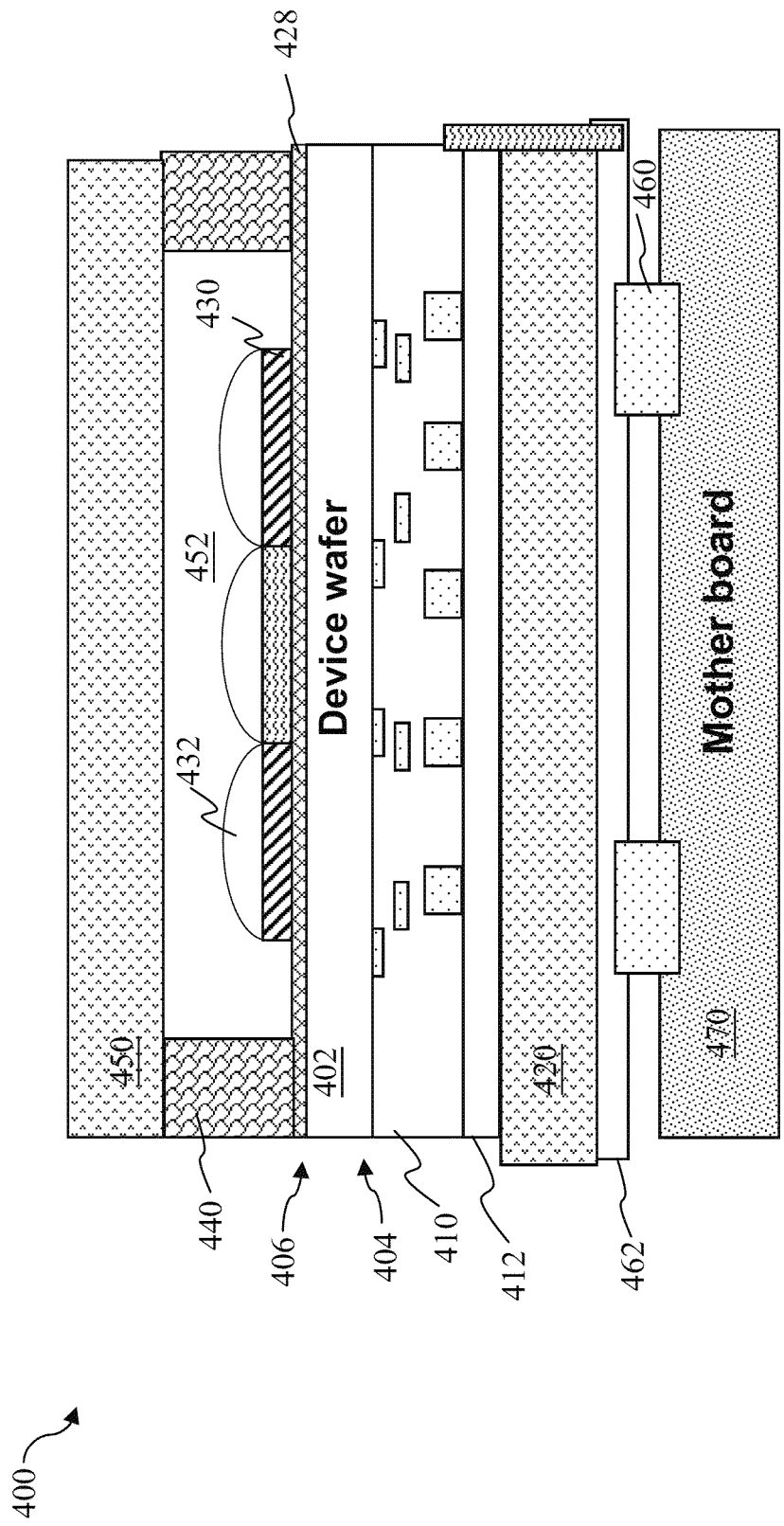

In FIG. 16, the BSI device 400 is coupled to a mother board 470 for chip packaging. The RDL 460 is coupled to the mother board 470 using various technologies such as flip-chip, ball grid array, wire bonding, chip bonding, and solder bump bonding. In an embodiment, under bump metallization (UBM) structures are formed in contact with the bonding pads of the RDL 460. Bonding structures such as solder balls are then formed on the UBM structures to connect to the mother board 470. It is noted that utilizing the glass substrate 420 instead of a carrier silicon substrate reduces fabrication costs and cycle time, and thus simplifies the fabrication process. The glass substrate does not have to be thinned down and through silicon vias (TSV) do not have to be formed for coupling to the interconnect structure 410 of the BSI device 400 during chip packaging. Further, chip packaging including formation of the RDL may be performed at an assembly house of a customer instead of the fabrication house (e.g., foundry) since thinning/grinding and TSV processing is not required.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although utilization of a glass substrate has been disclosed with reference to fabrication of a BSI device, it is understood that the methods disclosed herein are applicable to other types of applications that require utilizing a carrier substrate such as in 3-D integrated circuits (IC) and microelectromechanical systems (MEMS).

What is claimed is:

1. An image sensor comprising:
a device substrate having a frontside and a backside;
a plurality of pixels disposed at the frontside of the device substrate;
an interconnect structure disposed over the pixels;
a re-distribution layer (RDL) spaced apart from the interconnect structure;
a frontside substrate disposed between and connecting the RDL and the interconnect structure such that the RDL is spaced apart from the interconnect structure by the frontside substrate; and
a contact assembly electrically coupling the interconnect structure and the redistribution layer, wherein the contact assembly is disposed along an outer sidewall of the frontside substrate.

2. The image sensor of claim 1, wherein the frontside substrate is configured to provide support for thinning and processing the device substrate from the backside.

3. The image sensor of claim 1, wherein the interconnect structure includes a passivation layer, and wherein the frontside substrate is bonded to the passivation layer.

4. The image sensor of claim 1, further comprising a backside substrate disposed on the backside of the device substrate.

5. The image sensor of claim 1, further comprising:
a color filter layer disposed on the backside of the device substrate; and
a microlens layer disposed on the color filter layer,
wherein a cavity is formed between the backside substrate and the device substrate and
wherein the color filter layer and the microlens layer are disposed within the cavity.

6. The image sensor of claim 1, further comprising a board coupled to the RDL for chip packaging.

7. The image sensor of claim 1, wherein the frontside substrate is a glass substrate.

8. An image sensor device comprising:
a device substrate having a frontside and a backside, the frontside having a plurality of pixels formed thereupon;
an interconnect structure formed at the frontside;
a re-distribution layer (RDL) formed over the interconnect structure; and
a first substrate disposed between the interconnect structure and the RDL,
wherein the first substrate is a glass substrate, and
wherein the interconnect structure is separated from the RDL by the first substrate.

9. The image sensor of claim 8, wherein the first substrate is configured to provide support for thinning and processing the device substrate from the backside.

10. The device of claim 9, wherein the first substrate is further configured to allow electrical coupling of the interconnect structure and the RDL.

11. The device of claim 8, further comprising a contact assembly electrically coupling the interconnect structure and the redistribution layer.

12. The device of claim 8, further comprising:
a planarization layer disposed on the backside of the device substrate;
a color filter layer disposed on the planarization layer; and
a microlens layer disposed on the color filter layer.

13. The device of claim 12, further comprising:
a dam structure formed on the backside of the device substrate, the dam structure surrounding the color filter layer and the microlens layer; and
a second substrate disposed on the dam structure to form a cavity that contains the color filter layer and the microlens layer.

14. A semiconductor device comprising:
a device substrate;
a transistor formed upon the device substrate;
an interconnect structure formed over the device substrate;
a supporting substrate formed over the interconnect structure opposite the device substrate;
a re-distribution layer (RDL) formed over the supporting substrate and separated from the interconnect structure by the supporting substrate; and
a contact assembly coupling the interconnect structure to the RDL,
wherein the supporting substrate is a glass substrate.

15. The device of claim 14, wherein the supporting substrate is formed over a frontside surface of the device substrate and is configured to provide support for thinning and processing a backside surface of the device substrate.

16. The device of claim 14, further comprising a passivation layer formed between the interconnect structure and the supporting substrate, the supporting substrate bonded to the passivation layer.

17. The device of claim 16, wherein the passivation layer includes bonding pads configured to provide electrical connection with the interconnect structure.

18. The device of claim 17, wherein the RDL is isolated from the device substrate except for an electrical connection to the bonding pads.

19. The device of claim 14, wherein the transistor is part of a pixel device.

\* \* \* \* \*